United States Patent
Sato et al.

(10) Patent No.: US 11,570,893 B2
(45) Date of Patent: Jan. 31, 2023

(54) ELECTRICAL CONNECTION DEVICE, METHOD FOR PRODUCING THE SAME, AND STRUCTURE OF FLEXIBLE WIRING BOARD

(71) Applicant: JAPAN AVIATION ELECTRONICS INDUSTRY, LIMITED, Tokyo (JP)

(72) Inventors: Junya Sato, Tokyo (JP); Ryosuke Mitsui, Tokyo (JP); Yoshiaki Yamabayashi, Tokyo (JP); Atsushi Tanaka, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 17/736,482

(22) Filed: May 4, 2022

(65) Prior Publication Data
US 2022/0264744 A1    Aug. 18, 2022

Related U.S. Application Data

(62) Division of application No. 17/158,439, filed on Jan. 26, 2021, now Pat. No. 11,406,014.

(30) Foreign Application Priority Data

Mar. 6, 2020    (JP) .............................. JP2020-038975

(51) Int. Cl.
  *H05K 1/09*       (2006.01)
  *H05K 3/20*       (2006.01)
  *H05K 1/02*       (2006.01)

(52) U.S. Cl.
  CPC ............. *H05K 1/092* (2013.01); *H05K 1/028* (2013.01); *H05K 3/207* (2013.01)

(58) Field of Classification Search
  CPC ...... H05K 1/092; H05K 1/028; H05K 1/0195; H05K 1/0271; H05K 1/0277;
  (Continued)

(56) References Cited

U.S. PATENT DOCUMENTS

| 4,658,332 A | 4/1987 | Baker |
| 6,465,082 B1 * | 10/2002 | Takezawa ............ H05K 3/3436 |
| | | 428/209 |
| 2013/0241689 A1 | 9/2013 | Nakajima |

FOREIGN PATENT DOCUMENTS

| JP | 02185050 A * | 7/1990 | ............. H01L 24/14 |
| JP | 05074857 A * | 3/1993 | |

(Continued)

OTHER PUBLICATIONS

JP-05275489-A Machine Translation (Year: 2022).*

(Continued)

*Primary Examiner* — Hoa C Nguyen
*Assistant Examiner* — John B Freal
(74) *Attorney, Agent, or Firm* — Greenblum & Bernstein, P.L.C.

(57) ABSTRACT

In an electrical connection device in which an adhesive layer is disposed on a flexible base and a conductor pattern is provided on the adhesive layer, an elastomer pattern obtained by curing an ink containing an elastomer composition is formed on the adhesive layer, the conductor pattern obtained by curing an ink containing a conductive particle is formed on the elastomer pattern, and a longitudinal elastic modulus of the elastomer pattern is set to be larger than a longitudinal elastic modulus of the adhesive layer.

4 Claims, 9 Drawing Sheets

(58) Field of Classification Search
CPC ........ H05K 1/0281; H05K 1/118; H05K 1/11; H05K 2201/0133; H05K 2201/05; H05K 2201/09236; H05K 2201/0317; H05K 1/283; H05K 1/18
See application file for complete search history.

(56) References Cited

FOREIGN PATENT DOCUMENTS

| | | | | | |
|---|---|---|---|---|---|
| JP | 05275489 | A | * | 10/1993 | |
| JP | 09148720 | A | * | 6/1997 | ............ H01L 24/81 |
| JP | 2001-210933 | | | 8/2001 | |
| JP | 2001210933 | A | * | 8/2001 | ............ H01R 12/52 |
| JP | 4519011 | | | 8/2010 | |

OTHER PUBLICATIONS

JP-05074857-A Machine Translation (Year: 2022).*
JP-02185050-A Machine Translation (Year: 2022).*
JP-09148720-A Machine Translation (Year: 2022).*
JP-2001210933-A (Translation) (Year: 2022).*

* cited by examiner

ELECTRICAL CONNECTION DEVICE, METHOD FOR PRODUCING THE SAME, AND STRUCTURE OF FLEXIBLE WIRING BOARD

CROSS-REFERENCE TO RELATED APPLICATIONS

This application is a divisional application of U.S. patent application Ser. No. 17/158,439, filed on Jan. 26, 2021, which claims priority to Japanese Patent Application No. 2020-038975, filed on Mar. 6, 2020. The entire disclosure of each of the above-identified applications, including the specification, drawings, and claims, is incorporated herein in its entirety by reference.

TECHNICAL FIELD

The present invention relates to an electrical connection device and a method for producing an electrical connection device, and further relates to a wiring structure.

BACKGROUND ART

A film-type electrical connection device is well known, and FIG. 1 illustrates a configuration of an electrical connection device described in Japanese Registered Patent No. 4519011 as a prior art example of the film-type electrical connection device.

This electrical connection device 10 includes a base 11 made of a film having flexibility and an insulation property, a medium layer 12 that is arranged on the base 11 and is made of a gluing agent or an adhesive, reinforcing films 13 and 13' that are arranged in a pattern shape on the medium layer 12, and conductors 14 and 14' that are arranged on the reinforcing films 13 and 13' and are fixed on the reinforcing films 13 and 13'.

When the electrical connection device 10 is pressed on a connection object, the medium layer 12 is bonded or adheres to the connection object to be mechanically fixed to the connection object and the conductors 14 and 14' are pressed onto wiring (conductor part) of the connection object by elastic force of the medium layer 12 to obtain electrical connection.

The reinforcing films 13 and 13' are provided to enhance durability of the conductors 14 and 14', that is, the conductors 14 and 14' are hardly broken because the conductors 14 and 14' are fixed on the reinforcing films 13 and 13' which hardly stretch even when the medium layer 12 deforms.

This electrical connection device 10 is manufactured in the process described below.

(1) A metal thin film is formed on a film material 15 serving as a reinforcing film by sputtering, the metal thin film is further thickened by plating, an etching treatment is then applied to the metal thin film so as to obtain a wiring pattern shape, and plating is further applied to the wiring pattern, obtaining a wiring pattern 16 including the conductors 14 and 14' illustrated in FIG. 2A.

(2) Subsequently, exposed portion of the film material 15, on which the wiring pattern 16 is not formed, is drilled with laser so as to form holes 17 illustrated in FIG. 2B.

(3) Then, the film material 15 which is drilled is fixed to the medium layer 12 which is arranged on the base 11 and unnecessary portion is cut out.

Thus, the electrical connection device 10 illustrated in FIG. 1 is obtained.

As described above, the electrical connection device 10 which is in the prior art film type is manufactured in a manner in which the wiring pattern 16 is formed through a film forming process such as sputtering and plating and an etching process, and a drilling process with laser and a cutting process are further performed. Thus, manufacturing of the electrical connection device 10 of prior art is not simple and is accordingly inferior in mass productivity and customizability conforming to a design.

BRIEF SUMMARY OF THE INVENTION

An object of the present invention is to provide a film type electrical connection device which is easily manufactured, exhibiting excellent mass productivity and customizability and further exhibiting superior bending resistance and reliability, a method for producing the electrical connection device, and a wiring structure having these advantageous characteristics.

Effects of the Invention

According to the present invention, an elastomer pattern and a conductor pattern included in an electrical connection device are formed by printing.

According to the present invention, the electrical connection device is manufactured by printing and thus can be easily manufactured and exhibits excellent mass productivity and customizability, dissimilar to a prior art film-type electrical connection device which is manufactured through steps of sputtering, plating, etching, and laser processing.

Further, stress exerted on the conductor pattern in bending is reduced by the elastomer pattern, being able to suppress a phenomenon in which the stress increases a resistance value of the conductor pattern and further causes breakage of the conductor pattern. Thus, an electrical connection device exhibiting superior bending resistance and reliability can be obtained.

Furthermore, according to the present invention, a structure of a flexible wiring board that is easily manufactured and exhibits excellent bending resistance can be realized.

LIST OF REFERENCE NUMERALS

Figure 1:
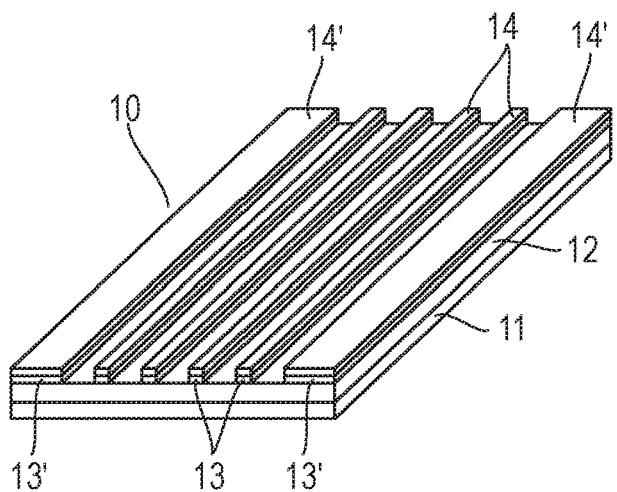
FIG. 1 is a perspective view illustrating a related art example of an electrical connection device.
Figure 2A:
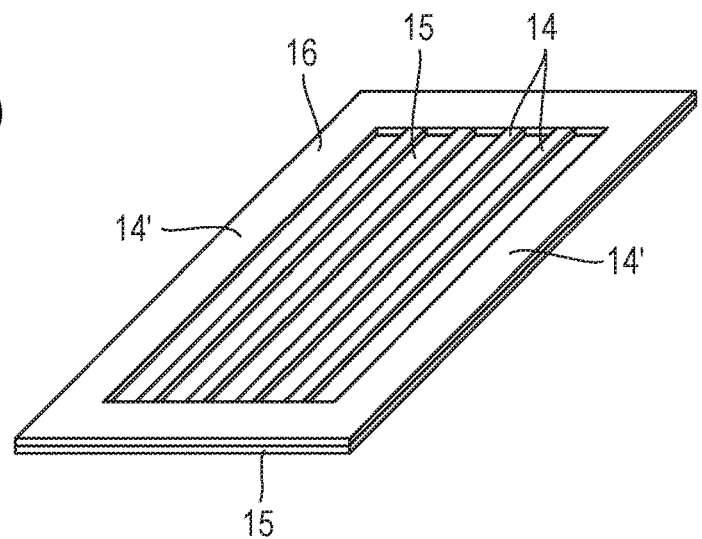
FIG. 2A is a diagram for explaining a method for manufacturing the electrical connection device illustrated in FIG. 1.
Figure 2B:
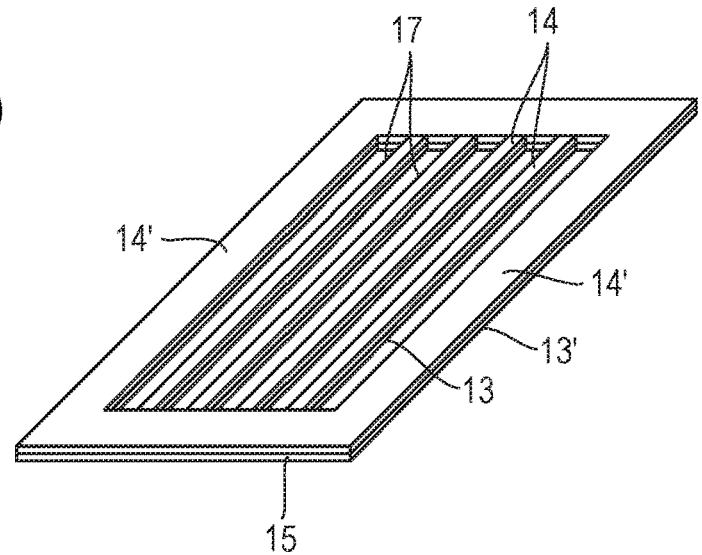
FIG. 2B is a diagram for explaining the method for manufacturing the electrical connection device illustrated in FIG. 1.

10: electrical connection device
11: base
12: medium layer
13, 13': reinforcing film
14, 14': conductor
15: film material
16: wiring pattern
17: hole
20: electrical connection device
21: base
22: adhesive layer
23: elastomer pattern
23': ink pattern
24: conductor pattern
24': ink pattern
25: elastomer layer
26: adhesive layer
27: base
28: blanket
30: first layer structure
31: base
32: first adhesive layer
33: elastomer pattern
34: conductor pattern
40: second layer structure
41: base
42: second adhesive layer
43: elastomer layer
50: wiring structure
60: first layer structure
61: base
62: first adhesive layer
63: first elastomer pattern
64: first conductor pattern
70: second layer structure
71: base
72: second adhesive layer
73: second elastomer pattern
74: second conductor pattern
80: wiring structure
81: wiring part

DETAILED DESCRIPTION

Figure 3:
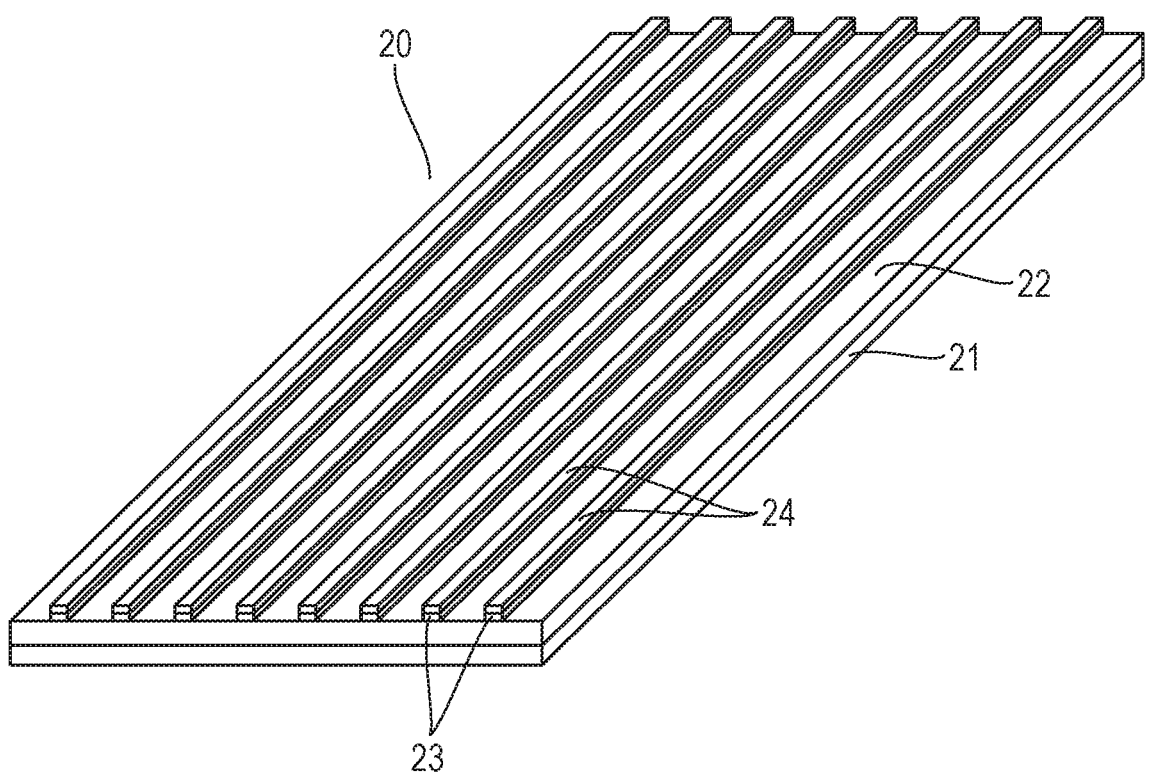
FIG. 3 is a perspective view illustrating an embodiment of an electrical connection device according to the present invention.

FIG. 3 illustrates a configuration of an embodiment of an electrical connection device according to the present invention. In this example, an electrical connection device 20 includes a base 21, an adhesive layer 22 which is disposed on the entire surface of the base 21, a plurality of lines of elastomer patterns 23 which are arrayed and formed on the adhesive layer 22, and conductor patterns 24 which are respectively formed on the elastomer patterns 23.

The elastomer patterns 23 and the conductor patterns 24 are configured to mutually have the same width and length and have an identical pattern shape in this example, and an array pitch and the number of lines of the elastomer patterns 23 and the conductor patterns 24 are determined depending on wiring of a connection object such as a wiring substrate to be connected.

In the above-mentioned configuration, the base 21 is a film base having flexibility. Examples of a material of the film base may include polyethylene terephthalate (PET), polyethylene naphthalate (PEN), and polyimide (PI).

The adhesive layer 22 elastically deforms in response to pressing and is bonded to a connection object, thus bearing mechanical coupling with the connection object. Also, the elastic restoring force of the adhesive layer 22 serves as a load in a direction pressing the conductor patterns 24 on wiring of the connection object. An adhesive constituting the adhesive layer 22 essentially contains a pressure sensitive adhesive (that is, a gluing agent) and may contain other types of adhesives such as a thermosetting type adhesive and a UV irradiation curable type adhesive. Examples of the adhesive include polyester based-, polyurethane based-, acrylic based-, epoxy based-, phenolic based-, silicone based-, polyolefin based-, polyimide based-, vinyl based-, and natural polymer based-polymers. The above-cited polymers may be singularly used or may be used in a combined manner.

Further, in order to enhance an adhesivity and a mechanical property, polyester based-, polyurethane based-, acrylic based-, epoxy based-, phenolic based-, silicone based-, polyolefin based-, polyimide based-, vinyl based-monomers or oligomers, for example, may be mixed with the above-cited polymers and used.

The elastomer patterns 23 are provided so as to reduce stress exerted on the conductor patterns 24 when the electrical connection device 20 is bent, for example. Both of the elastomer patterns 23 and the conductor patterns 24 are formed by printing in this example.

Printing for the conductor patterns 24 is performed by using an ink containing conductive particles such as gold particles, silver particles, and copper particles and the conductor patterns 24 are formed by heat-curing the ink.

The elastomer patterns 23 reduce stress exerted on the conductor patterns 24 when the electrical connection device 20 is bent as described above, in other words, the elastomer patterns 23 function in such a way that even when the adhesive layer 22 expands and contracts in response to bending of the base 21, the conductor patterns 24 are less susceptible to an influence of the expansion and contraction of the adhesive layer 22. Accordingly, a longitudinal elastic modulus $E_2$ of the elastomer patterns 23 interposed between the adhesive layer 22 and the conductor patterns 24 is set to be larger than a longitudinal elastic modulus $E_1$ of the adhesive layer 22. A longitudinal elastic modulus is also called Young's modulus.

Printing for the elastomer patterns 23 is performed by using an ink containing an elastomer composition constituting elastomer, and the elastomer patterns 23 containing elastomer is formed by heat-curing the ink. Examples of the elastomer to be employed include silicone rubber, urethane rubber, fluoro-rubber, nitrile rubber, acrylic rubber, styrene rubber, chloroprene rubber, and ethylene-propylene rubber.

The longitudinal elastic modulus $E_2$ of the elastomer pattern 23 is set to be larger than the longitudinal elastic modulus $E_1$ of the adhesive layer 22 (though depending on a material, the longitudinal elastic modulus $E_1$ is commonly 0.01 to 1 MPa). Here, results of a bending test that were obtained by using samples, the elastomer patterns 23 of which mutually have different longitudinal elastic moduli $E_2$, will be described.

Five kinds of samples whose longitudinal elastic moduli $E_2$ were 1 MPa, 10 MPa, 100 MPa, 1000 MPa, and 1500 MPa were prepared under the condition that the samples have the same layer structure as that of the electrical connection device 20 illustrated in FIG. 3. The longitudinal elastic modulus $E_1$ of the adhesive layer 22 of every sample was set to be 0.1 MPa. The conductor patterns 24 were formed with an ink containing silver particles. Regarding the layer thickness of each layer, the base 21 is 0.025 mm thick, the adhesive layer 22 is 0.050 mm thick, the elastomer pattern 23 is 0.010 mm thick, and the conductor pattern 24 is 0.010 mm thick.

In the bending test, the samples were repeatedly bent (curved) by 180° in a manner in which the conductor patterns 24 were folded to be seen outside, and change in a resistance value of the conductor patterns 24 corresponding to the number of times of bending was examined. The bent portion was set to have an arc shape of 3 mm radius (half of an external diameter).

Figure 4:
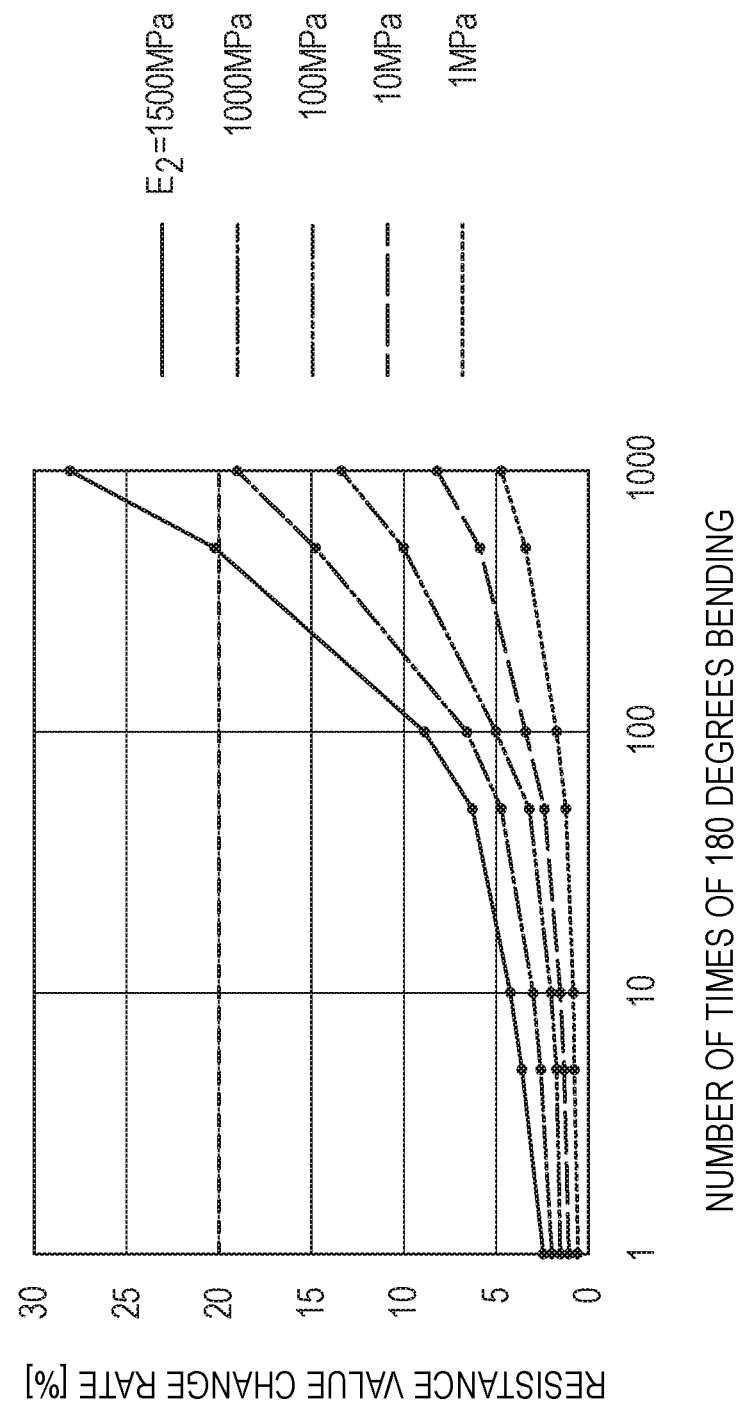
FIG. 4 is a graph showing bending test results obtained when a longitudinal elastic modulus of an elastomer pattern was changed.

A graph in FIG. 4 illustrates results of the bending test, and change (increase) in a resistance value of the conductor patterns 24 caused by bending is shown as a change rate.

FIG. 4 shows that change in a resistance value is larger as the longitudinal elastic modulus $E_2$ of the elastomer pattern 23 is larger. If a criteria that a resistance value change rate in 1000 times of 180° bending is equal to or smaller than 20% is set, for example, it can be said that the longitudinal elastic modulus $E_2$ of 1500 MPa of the elastomer pattern 23 does not satisfy the criteria and the longitudinal elastic modulus $E_2$ which is set to be equal to or smaller than 1000 MPa is preferable. This is because an excessively large longitudinal elastic modulus $E_2$ causes an occurrence and advance of breakage of the elastomer pattern 23 itself along with increase in the number of times of bending and the breakage of the elastomer pattern 23 induces an occurrence and advance of breakage of the conductor pattern 24, deteriorating an electro-conductive property. Here, FIG. 4 shows that the resistance value change of the sample whose longitudinal elastic modulus $E_2$ is 1 MPa is the smallest and accordingly, advantageous effects of stress reduction can be sufficiently obtained when the longitudinal elastic modulus $E_2$ is set to be approximately 10 times larger than the longitudinal elastic modulus $E_1$ of the adhesive layer 22.

Figure 5A:
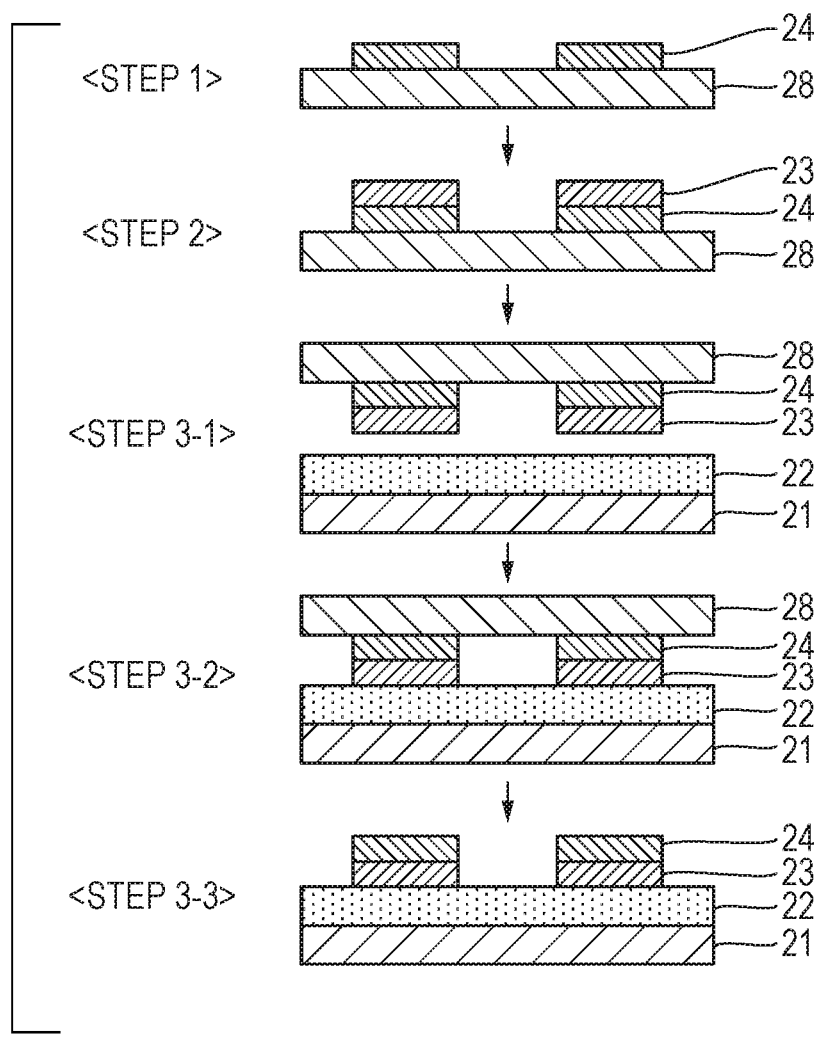
FIG. 5A is a process diagram for explaining a method for producing an electrical connection device according to the present invention.

A method for producing the above-described electrical connection device 20 will now be described in a step order with reference to FIG. 5A.

Both of the elastomer patterns 23 and the conductor patterns 24 are formed by offset printing. Here, a plate used in the following steps 1 and 1' and steps 2 and 2' may be a screen plate, a gravure plate, or another printing plate. In other words, printing performed in these steps may be screen printing, gravure printing, or another kind of printing.

<Step 1>

Ink patterns containing conductive particles are printed from a plate to a blanket 28 and are heat-cured to form the conductor patterns 24.

<Step 2>

Ink patterns containing an elastomer composition are printed from a plate to the conductor patterns 24 on the blanket 28 in a manner to lie over the conductor patterns 24 and the patterns are heat-cured to form the elastomer patterns 23.

<Step 3-1> to <Step 3-3>

The conductor patterns 24 and the elastomer patterns 23 are transferred from the blanket 28 onto the adhesive layer 22 disposed on the base 21 having flexibility so that the elastomer patterns 23 are positioned immediately on the adhesive layer 22.

Through the above-described steps, the electrical connection device 20 is completed.

Figure 5B:
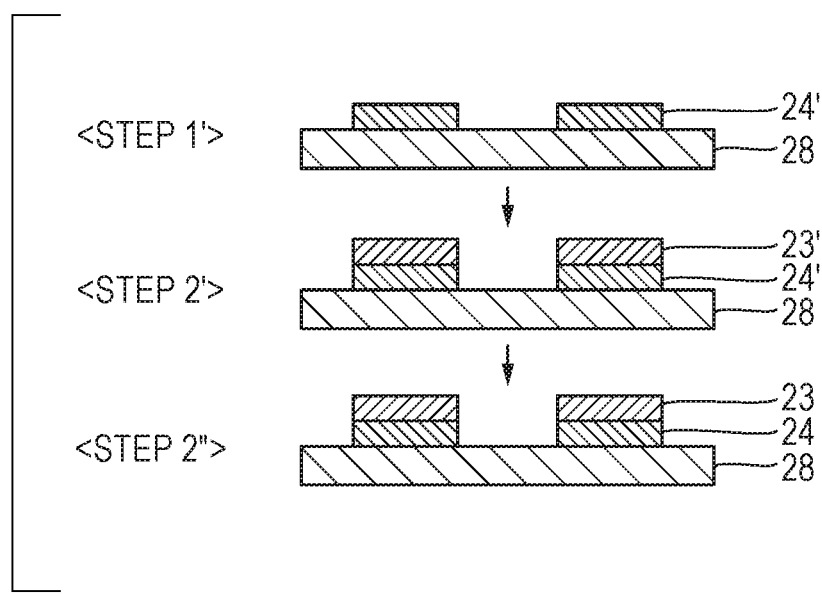
FIG. 5B is a process diagram for explaining a partially-changed example of the process shown in FIG. 5A.
Figure 6A:
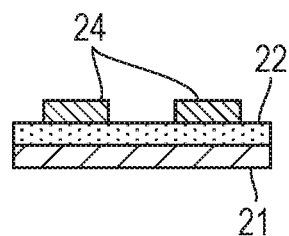
FIG. 6A is a diagram illustrating a layer structure of a sample A used in a bending test.
Figure 6B:
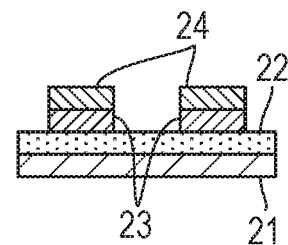
FIG. 6B is a diagram illustrating a layer structure of a sample B used in the bending test.
Figure 6C:
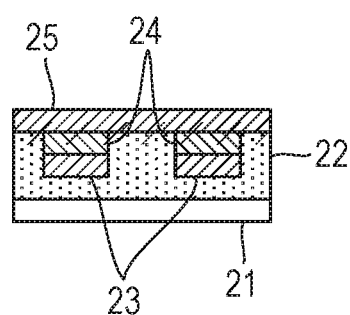
FIG. 6C is a diagram illustrating a layer structure of a sample C used in the bending test.
Figure 6D:
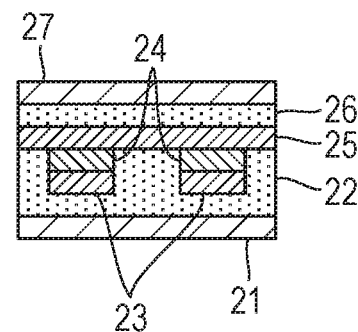
FIG. 6D is a diagram illustrating a layer structure of a sample D used in the bending test.

Here, the above-described steps 1 and 2 may be changed to steps 1', 2', and 2" described below depending on a kind of an ink to be used, a curing condition, and the like (see FIG. 5B).

<Step 1'>

Ink patterns 24' containing conductive particles are printed from a plate to the blanket 28.

<Step 2'>

Ink patterns 23' containing an elastomer composition are printed from a plate onto the ink patterns 24' containing conductive particles on the blanket 28 in a manner to lie over the ink patterns 24'.

<Step 2">

The ink patterns 24' containing conductive particles and the ink patterns 23' containing an elastomer composition are simultaneously heat-cured, forming the conductor patterns 24 and the elastomer patterns 23.

The electrical connection device and the method for producing the electrical connection device according to the present embodiment have been described thus far. According to this embodiment, both of the conductor patterns 24 and the elastomer patterns 23 are formed by printing and thus, the manufacturing is easy and exhibits excellent mass productivity and customizability.

Further, stress exerted on the conductor patterns 24 when the electrical connection device 20 is bent is reduced by the elastomer patterns 23 interposed between the adhesive layer 22 and the conductor patterns 24, being able to suppress an occurrence of a phenomenon of increase in a resistance value of the conductor patterns 24 and resulting complete breakage of the conductor patterns 24. Thus, the conductor patterns 24 exhibit superior bending resistance and reliability.

As described above, stress exerted on the conductor patterns 24 in bending can be reduced and bending resistance of the conductor patterns 24 can be improved by disposing an elastic body (the elastomer patterns 23) whose longitudinal elastic modulus $E_2$ is larger than the longitudinal elastic modulus $E_1$ of the adhesive layer 22. The following description is about results of a bending test obtained by examining whether or not the bending resistance further improves when employing a layer structure in which the conductor patterns 24 are interposed between elastic bodies.

FIGS. 6A to 6D illustrate layer structures of samples A to D used in the bending test and FIGS. 6A to 6D give the same reference numerals to portions corresponding to respective portions in the layer structure of the electrical connection device 20 illustrated in FIG. 3.

The sample A is obtained by eliminating the elastomer patterns 23 from the layer structure of FIG. 3 and is provided as a comparison. The sample B has the layer structure of FIG. 3. The sample C is obtained in a manner in which an elastomer layer 25, which is formed with an ink that is the same as the ink used for print-forming the elastomer patterns 23, is disposed on the conductor patterns 24 of the layer structure of FIG. 3 to extend over the entire surface of the sample and the elastomer layer 25 is bonded to the adhesive layer 22 by pressing.

The sample D has a layer structure in which an adhesive layer 26, which is made of the same adhesive as the adhesive layer 22, and a base 27 are disposed on the elastomer layer 25 of the sample C. The sample D is obtained by disposing the base 27 with the adhesive layer 26 and the elastomer layer 25 formed thereon onto the sample B in a state in which the elastomer layer 25 faces below and pressing them. Here, longitudinal elastic moduli of the elastomer patterns 23 and the elastomer layer 25 of all samples were set to be 500 MPa.

Regarding the layer thickness of each layer, the base 21 is 0.025 mm thick, the adhesive layer 22 is 0.050 mm thick, the elastomer pattern 23 is 0.010 mm thick, the conductor pattern 24 is 0.010 mm thick, the elastomer layer 25 is 0.010 mm thick, the adhesive layer 26 is 0.050 mm thick, and the base 27 is 0.025 mm thick.

Figure 7:
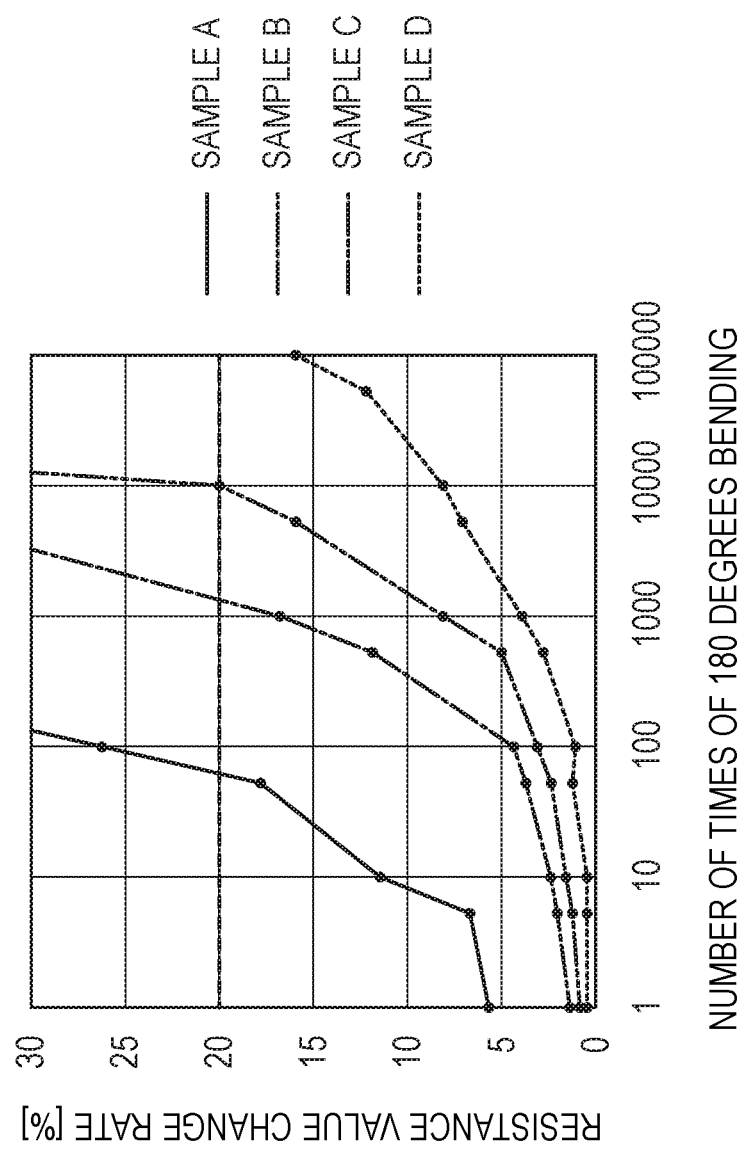
FIG. 7 is a graph showing bending test results of respective samples illustrated in FIGS. 6A to 6D.

The bending test was performed in the same manner as the above-described bending test. A graph of FIG. 7 shows the results of the bending test. This graph shows that the bending resistance of the sample C in which the conductor patterns 24 are interposed between elastic bodies improved more than that of the sample B and the bending resistance of the sample D improved further than that of the sample C. It is considered that this is because the conductor patterns 24 are positioned at the center of the cross section in the sample D, so that compressive stress or tensile stress is basically rarely exerted on the conductor patterns 24 even if the sample D is bent.

A structure of a flexible wiring board according to the present embodiment will now be described with reference to FIGS. 8A, 8B, and 9.

Figure 8A:
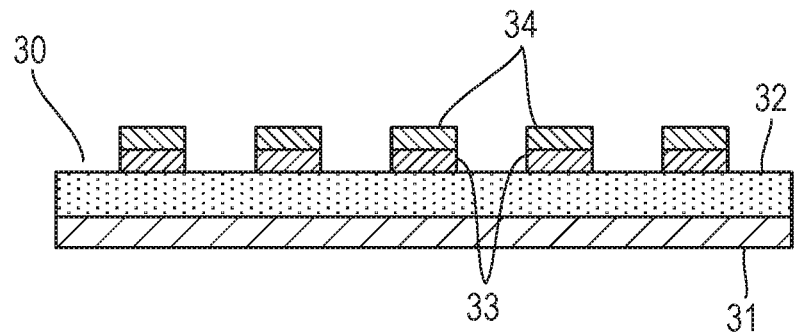
FIG. 8A is a diagram illustrating a first layer structure used for an embodiment of a wiring structure according to the present invention.
Figure 8B:
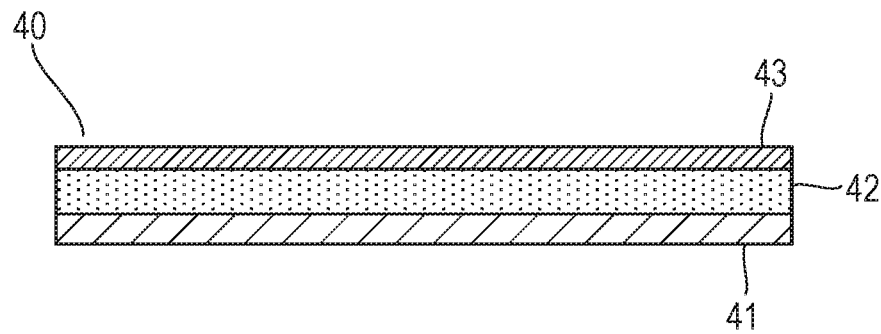
FIG. 8B is a diagram illustrating a second layer structure used for the embodiment of the wiring structure according to the present invention.
Figure 9:
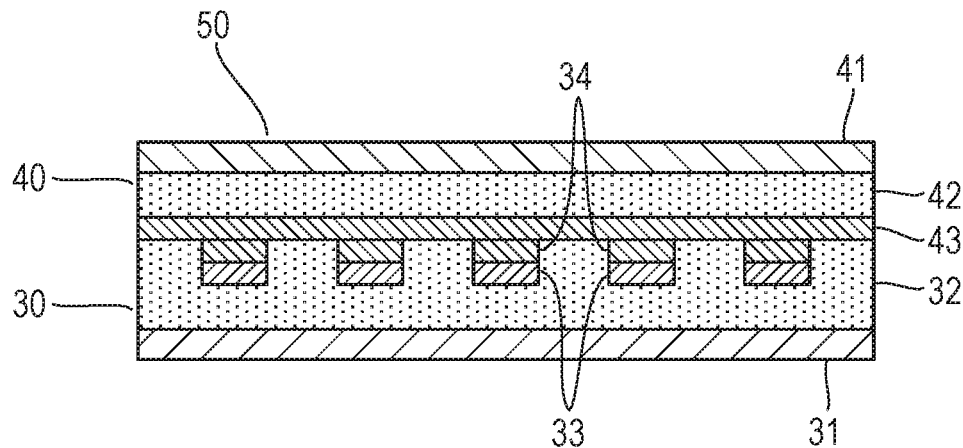
FIG. 9 is a diagram illustrating the embodiment of the wiring structure according to the present invention.

FIG. 9 illustrates an embodiment of a wiring structure according to the present invention, and FIGS. 8A and 8B respectively illustrate a first layer structure and a second layer structure constituting the wiring structure illustrated in FIG. 9.

As illustrated in FIG. 8A, a first layer structure 30 is structured in a manner in which a first adhesive layer 32 is disposed on a first flexible base 31, elastomer patterns 33 obtained by curing an ink containing an elastomer composition are formed on the first adhesive layer 32, and conductor patterns 34 obtained by curing an ink containing conductive particles are formed on the elastomer patterns 33.

As illustrated in FIG. 8B, a second layer structure 40 is structured in a manner in which a second adhesive layer 42 is disposed on a second flexible base 41 and an elastomer layer 43 obtained by curing an ink containing an elastomer composition is disposed on the second adhesive layer 42.

The first layer structure 30 and the second layer structure 40 are superposed to each other so that a surface on which the conductor patterns 34 are formed and a surface on which the elastomer layer 43 is disposed face each other. The first layer structure 30 and the second layer structure 40 are mechanically coupled and integrated with each other by bonding a surface, on which the elastomer patterns 33 and the conductor patterns 34 are not formed, of the first adhesive layer 32 and a surface of the elastomer layer 43 to each other. Thus, a wiring structure 50 illustrated in FIG. 9 is structured.

Here, the wiring structure 50 may be manufactured by a method in which the first layer structure 30 and the second layer structure 40 are independently manufactured and then bonded to each other or, for example, a method in which the elastomer patterns 33, the conductor patterns 34, and the elastomer layer 43 are transferred onto the first adhesive layer 32 which is disposed on the base 31 and the base 31 having the obtained structure is bonded with the base 41 on which the second adhesive layer 42 is disposed.

The wiring structure 50 has the layer structure of the sample D used in the above-described bending test and accordingly, exhibits excellent bending resistance. Here, the first adhesive layer 32 and the second adhesive layer 42 are made of the same adhesive, and the longitudinal elastic moduli of the elastomer patterns 33 and the elastomer layer 43 are set to be larger than the longitudinal elastic moduli of the first and second adhesive layers 32 and 42.

Another embodiment of a wiring structure for a flexible wiring board according to the present invention will now be described with reference to FIGS. 10A, 10B, and 11.

Figure 10A:
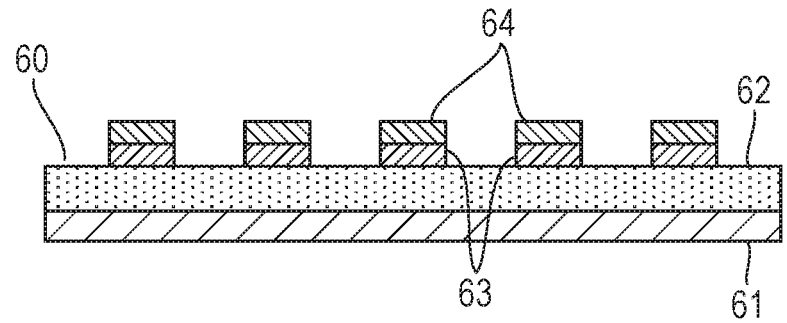
FIG. 10A is a diagram illustrating a first layer structure used for another embodiment of a wiring structure according to the present invention.
Figure 10B:
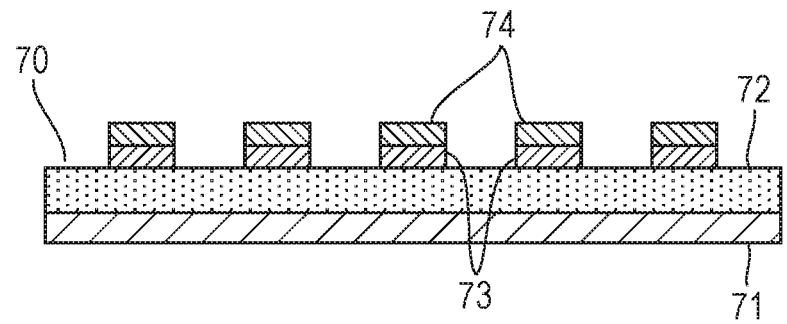
FIG. 10B is a diagram illustrating a second layer structure used for the other embodiment of the wiring structure according to the present invention.
Figure 11:
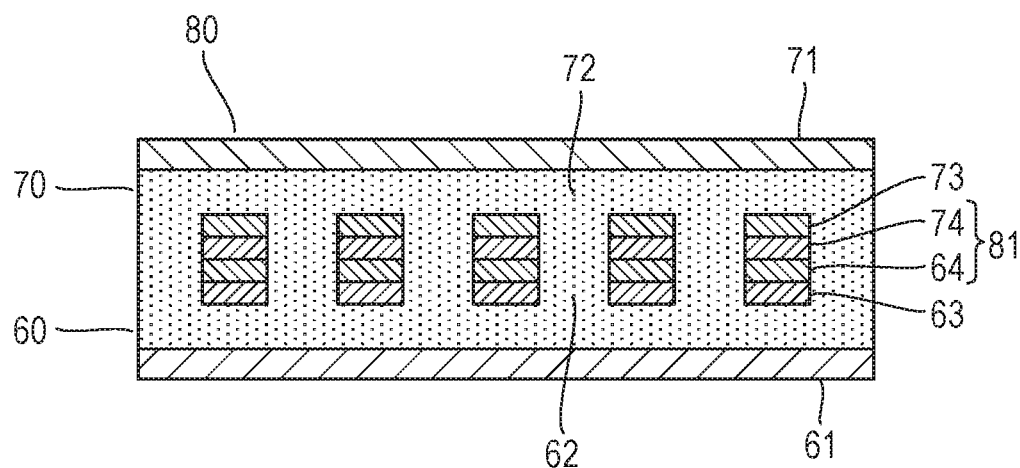
FIG. 11 is a diagram illustrating the other embodiment of the wiring structure according to the present invention.

FIGS. 10A and 10B respectively illustrate a first layer structure and a second layer structure, and the first layer structure and the second layer structure constitute a wiring structure illustrated in FIG. 11.

As illustrated in FIG. 10A, a first layer structure 60 is structured in a manner in which a first adhesive layer 62 is disposed on a first flexible base 61, first elastomer patterns 63 obtained by curing an ink containing an elastomer composition are formed on the first adhesive layer 62, and first conductor patterns 64 obtained by curing an ink containing conductive particles are formed on the first elastomer patterns 63.

As illustrated in FIG. 10B, a second layer structure 70 is structured in a manner in which a second adhesive layer 72 is disposed on a second flexible base 71, second elastomer patterns 73 obtained by curing an ink containing an elastomer composition are formed on the second adhesive layer 72, and second conductor patterns 74 obtained by curing an ink containing conductive particles are formed on the second elastomer patterns 73.

The first layer structure 60 has the same structure as that of the above-described first layer structure 30 illustrated in FIG. 8A and the second layer structure 70 has the same structure as that of the first layer structure 60 in this example.

The first layer structure 60 and the second layer structure 70 are superposed to each other so that a surface on which the first conductor patterns 64 are formed and a surface on which the second conductor patterns 74 are formed face each other. Accordingly, the first conductor patterns 64 and the second conductor patterns 74 are superposed to each other and come into direct contact with each other, structuring wiring parts 81.

The first layer structure 60 and the second layer structure 70 are mechanically coupled and integrated with each other by bonding a surface of the first adhesive layer 62, on which the first elastomer patterns 63 and the first conductor patterns 64 are not formed, and a surface of the second adhesive layer 72, on which the second elastomer patterns 73 and the second conductor patterns 74 are not formed, to each other. Thus, a wiring structure 80 illustrated in FIG. 11 is structured.

Here, the wiring structure 80 may be manufactured by a method in which the first layer structure 60 and the second layer structure 70 are independently manufactured and then bonded to each other or, for example, a method in which the first elastomer patterns 63, the first conductor patterns 64, the second conductor patterns 74, and the second elastomer patterns 73 are transferred onto the first adhesive layer 62 which is disposed on the base 61 and the base 61 having the obtained structure is bonded with the base 71 on which the second adhesive layer 72 is disposed.

The first adhesive layer 62 and the second adhesive layer 72 elastically deform in response to pressing to be bonded to each other and the elastic restoring force thereof serves as a load in a direction in which the first conductor patterns 64 and the second conductor patterns 74 are pressed against each other, being able to obtain a favorable pressing state, that is, a favorable electrically-coupling state between the first conductor patterns 64 and the second conductor patterns 74. Accordingly, the wiring part 81 with low resistance can be structured. Here, the longitudinal elastic moduli of the first and second elastomer patterns 63 and 73 are set to be larger than the longitudinal elastic moduli of the first and second adhesive layers 62 and 72.

A cross section of the wiring structure 80 has a vertically-symmetric structure as illustrated in FIG. 11 and the wiring parts 81 are positioned at the center of the cross section, so that resistance of the wiring parts 81 are lowered and the wiring structure 80 also exhibits excellent bending resistance in this example similarly to the wiring structure 50 illustrated in FIG. 9.

The embodiments have been described thus far, but conductor patterns may be print-formed with conductive stretchable paste, for example. In this case, since stretchable conductor patterns still have a limit in resistance to bending, provision of elastomer patterns effectively enhances the wiring's bending resistance. Further, when conductor patterns are not formed with the above-mentioned conductive stretchable paste and elastomer patterns have an identical pattern shape to that of the conductor patterns, the elastomer patterns may be set to have conductivity, that is, may be print-formed with the conductive stretchable paste so as to obtain stronger bending resistance and lower wiring resistance compared to the structure without the elastomer patterns.

The foregoing description of the embodiments of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for producing an electrical connection device that includes:
    a flexible base;
    an adhesive layer on the flexible base, the adhesive layer containing a pressure sensitive adhesive and having a predetermined longitudinal elastic modulus;
    an elastomer pattern on the adhesive layer, the elastomer pattern having a predetermined longitudinal elastic modulus larger than the predetermined longitudinal elastic modulus of the adhesive layer; and
    a conductor pattern on the elastomer pattern,
    the method comprising:
    printing on a blanket the conductive pattern using ink containing conductive particles;
    thermally curing the conductive pattern;
    printing on the conductive pattern the elastomer pattern using ink containing an elastomer composition;
    thermally curing the elastomer pattern to have the predetermined longitudinal elastic modulus; and
    transferring together the conductor pattern and the elastomer pattern from the blanket onto the adhesive layer having the predetermined longitudinal elastic modulus, in such a way as to make the elastomer pattern locate on the adhesive layer.

2. A method for producing an electrical connection device that includes:
    a flexible base;
    an adhesive layer on the flexible base, the adhesive layer containing a pressure sensitive adhesive and having a predetermined longitudinal elastic modulus;
    an elastomer pattern on the adhesive layer, the elastomer pattern having a predetermined longitudinal elastic modulus larger than the predetermined longitudinal elastic modulus of the adhesive layer; and
    a conductor pattern on the elastomer pattern,
    the method comprising:
    printing on a blanket the conductive pattern using ink containing conductive particles;
    printing on the conductive pattern the elastomer pattern using ink containing an elastomer composition;
    thermally curing together the conductor pattern and the elastomer pattern, thereby achieving the predetermined longitudinal elastic modulus of the elastomer pattern; and
    transferring together the conductor pattern and the elastomer pattern from the blanket onto the adhesive layer having the predetermined longitudinal elastic modulus, in such a way as to make the elastomer pattern locate on the adhesive layer.

3. A wiring structure of a flexible wiring board comprising:
    a first layer structure including a first flexible base, a first adhesive layer, an elastomer pattern, and a conductor pattern; and
    a second layer structure adhering to the first layer structure, the second layer structure including a second flexible base, a second adhesive layer, and an elastomer layer,
    wherein
    the first adhesive layer is located on the first flexible base and contains a first pressure sensitive adhesive;
    the elastomer pattern is located on the first adhesive layer and is made of a cured ink containing a first elastomer composition;
    the conductor pattern is located on the elastomer pattern and is made of a cured ink containing conductive particles;
    the second adhesive layer is located on the second flexible base and contains a second pressure sensitive adhesive,
    the elastomer layer is located on the second adhesive layer and is made of a cured ink containing a second elastomer composition,
    the first adhesive layer has an adhesive plane as part thereof that the elastomer pattern and the conductor pattern are not located on, the elastomer layer adheres to the adhesive plane of the first adhesive layer to make the second layer structure adhere to the first layer structure, the first adhesive layer has a predetermined longitudinal elastic modulus, the second adhesive layer has a predetermined longitudinal elastic modulus the elastomer pattern has a predetermined longitudinal elastic modulus larger than the predetermined longitudinal elastic modulus of the first adhesive layer, and the elastomer layer has a predetermined longitudinal elastic modulus larger than the predetermined longitudinal elastic modulus of the second adhesive layer.

4. A wiring structure of a flexible wiring board comprising:
- a first layer structure including a first flexible base, a first adhesive layer, a first elastomer pattern, and a first conductor pattern; and
- a second layer structure adhering to the first layer structure, the second layer structure including a second flexible base, a second adhesive layer, a second elastomer layer, and a second conductor pattern, wherein the first adhesive layer is located on the first flexible base and contains a first pressure sensitive adhesive, the first elastomer pattern is located on the first adhesive layer and is made of a cured ink containing a first elastomer composition;

the first conductor pattern is located on the first elastomer pattern and is made of a cured ink containing first conductive particles;

the second adhesive layer is located on the second flexible base and contains a second pressure sensitive adhesive, the second elastomer pattern is located on the second adhesive layer and is made of a cured ink containing a second elastomer composition, the second conductor pattern is located on the second elastomer pattern and is made of a cured ink containing second conductive particles, the first adhesive layer has an adhesive plane as part thereof that the first elastomer pattern and the first conductor pattern are not located on, the second adhesive layer has an adhesive plane as part thereof that the second elastomer pattern and the second conductor pattern are not located on, the adhesive plane of the first adhesive layer and the adhesive plane of the second adhesive layer adheres to each other to make the first layer structure and the second layer structure adhere to each other, the first adhesive layer has a predetermined longitudinal elastic modulus, the second adhesive layer has a predetermined longitudinal elastic modulus, the first elastomer pattern has a predetermined longitudinal elastic modulus larger than the predetermined longitudinal elastic modulus of the first adhesive layer, and the second elastomer layer has a predetermined longitudinal elastic modulus larger than the predetermined longitudinal elastic modulus of the second adhesive layer.

\* \* \* \* \*